(12) United States Patent
Nayak (10) Patent No.: US 11,140,767 B2
(45) Date of Patent: Oct. 5, 2021

(54) CONDUCTIVE THERMAL MANAGEMENT ARCHITECTURE FOR ELECTRONIC MODULES IN A TWO-CARD ASSEMBLY

(71) Applicant: Hamilton Sundstrand Corporation, Charlotte, NC (US)

(72) Inventor: Hebri Vijayendra Nayak, Rockford, IL (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 0 days.

(21) Appl. No.: 16/810,343

(22) Filed: Mar. 5, 2020

(65) Prior Publication Data

US 2021/0282258 A1     Sep. 9, 2021

(51) Int. Cl.
H05K 1/02        (2006.01)
H05K 7/14        (2006.01)
H05K 7/20        (2006.01)

(52) U.S. Cl.
CPC ......... H05K 1/0204 (2013.01); H05K 7/1404 (2013.01); H05K 7/2049 (2013.01)

(58) Field of Classification Search
CPC .... H05K 1/0204; H05K 1/144; H05K 7/1404; H05K 7/2049; H05K 7/209; H05K 7/1422; H05K 5/0021; H05K 5/0043
See application file for complete search history.

(56) References Cited

U.S. PATENT DOCUMENTS

| | | | |
|---|---|---|---|
| 6,285,556 B1 | 9/2001 | Guth et al. | |
| 6,392,891 B1* | 5/2002 | Tzlil | H05K 7/1404 257/727 |
| 8,009,420 B1 | 8/2011 | Hill et al. | |
| 8,755,188 B2 | 6/2014 | Stella | |
| 8,942,005 B2* | 1/2015 | Geswender | F42C 19/06 361/792 |
| 8,987,777 B2 | 3/2015 | Hauenstein | |
| 9,781,867 B2* | 10/2017 | Yonak | B60K 6/383 |
| 2006/0109631 A1* | 5/2006 | Marro | H05K 7/20545 361/718 |
| 2011/0141692 A1 | 6/2011 | Bult | |
| 2018/0014426 A1* | 1/2018 | Kim | H05K 3/4608 |
| 2019/0380225 A1 | 12/2019 | Thompson et al. | |

FOREIGN PATENT DOCUMENTS

| | | |
|---|---|---|
| CN | 203746840 U | 7/2014 |
| CN | 110254247 A | 9/2019 |
| CN | 110266193 A | 9/2019 |
| CN | 110601615 A | 12/2019 |
| EP | 3206469 A1 | 8/2017 |

OTHER PUBLICATIONS

Extended European Search Report for EP Application No. 21160962.3 dated Jul. 20, 2021, pp. 1-9.

* cited by examiner

Primary Examiner — Mukundbhai G Patel
(74) Attorney, Agent, or Firm — Cantor Colburn LLP (57) ABSTRACT

A two-card assembly includes a first printed wiring board (PWB) on a first side of the two-card assembly, and a first stiffener secured to the first PWB. The two-card assembly also includes a second PWB on a second side of the two-card assembly, and a second stiffener secured to the second PWB. A center stiffener is disposed between the first stiffener and the second stiffener, and one or more electronic modules are secured to the center stiffener. The center stiffener dissipates heat from the one or more electronic modules.

18 Claims, 11 Drawing Sheets

CONDUCTIVE THERMAL MANAGEMENT ARCHITECTURE FOR ELECTRONIC MODULES IN A TWO-CARD ASSEMBLY

BACKGROUND

Exemplary embodiments pertain to the art of electronic modules and, in particular, to a conductive thermal management architecture for electronic modules in a two-card assembly.

In a broad range of applications, electronic components are packaged as electronic modules. The electronic modules are supported and interconnected with printed wiring boards (PWBs). A two-card assembly, for example, refers to two PWBs stacked with electronic modules between them. Typically, electronic components placed directly on a PWB dissipate heat through the PWB. Electronic modules dissipate heat from a side that is opposite the side in contact with the PWB.

BRIEF DESCRIPTION

In one embodiment, a two-card assembly includes a first printed wiring board (PWB) on a first side of the two-card assembly, a first stiffener secured to the first PWB, and a second PWB on a second side of the two-card assembly. The two-card assembly also includes a second stiffener secured to the second PWB, and a center stiffener disposed between the first stiffener and the second stiffener. One or more electronic modules are secured to the center stiffener. The center stiffener dissipates heat from the one or more electronic modules.

Additionally or alternatively, in this or other embodiments wedge locks secure the center stiffener between the first stiffener and the second stiffener based on compressive force.

Additionally or alternatively, in this or other embodiments a first wedge lock mounting rail supports a first set of the wedge locks, and a second wedge lock mounting rail supports a second set of the wedge locks.

Additionally or alternatively, in this or other embodiments first edges of the second stiffener and center stiffener form the first wedge lock mounting rail and second edges of the second stiffener and center stiffener form the second wedge lock mounting rail.

Additionally or alternatively, in this or other embodiments the second stiffener includes a slot within which the center stiffener is disposed.

Additionally or alternatively, in this or other embodiments the first stiffener is bonded to the first PWB, and the second stiffener is bonded to the second PWB.

Additionally or alternatively, in this or other embodiments a material of the first stiffener, the second stiffener, and the center stiffener is aluminum alloy.

Additionally or alternatively, in this or other embodiments a first one or more of the electronic modules are secured to a first side of the center stiffener and a second one or more of the electronic modules are secured to a second side of the center stiffener Additionally or alternatively, in this or other embodiments the first one or more of the electronic modules are also secured to the first PWB.

Additionally or alternatively, in this or other embodiments the second one or more of the electronic modules are also secured to the second PWB.

In another embodiment a method includes securing a first printed wiring board (PWB), on a first side of the two-card assembly, to a first stiffener, and securing a second PWB, on a second side of the two-card assembly, to a second stiffener. The method also includes disposing a center stiffener between the first stiffener and the second stiffener. One or more electronic modules are secured to the center stiffener to dissipate heat via the center stiffener.

Additionally or alternatively, in this or other embodiments compressive force is transferred via wedge locks to secure the center stiffener between the first stiffener and the second stiffener.

Additionally or alternatively, in this or other embodiments a first set of the wedge locks is supported on a first wedge lock mounting rail formed of first edges of the second stiffener and center stiffener, and a second set of the wedge locks is supported on a second wedge lock mounting rail formed of second edges of the second stiffener and center stiffener.

Additionally or alternatively, in this or other embodiments the disposing the center stiffener includes disposing the center stiffener into a slot within the second stiffener.

Additionally or alternatively, in this or other embodiments the securing the first PWB to the first stiffener includes bonding the first stiffener to the first PWB, and the securing the second PWB to the second stiffener includes bonding the second stiffener to the second PWB.

Additionally or alternatively, in this or other embodiments the first stiffener, the second stiffener, and the center stiffener are fabricated from aluminum alloy.

Additionally or alternatively, in this or other embodiments the securing the one or more electronic modules to the center stiffener includes securing a first one or more of the electronic modules to a first side of the center stiffener.

Additionally or alternatively, in this or other embodiments the first one or more of the electronic modules is secured to the first PWB.

Additionally or alternatively, in this or other embodiments the securing the one or more electronic modules to the center stiffener includes securing a second one or more of the electronic modules to a second side of the center stiffener.

Additionally or alternatively, in this or other embodiments the second one or more of the electronic modules is secured to the second PWB.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

As previously noted, electronic modules on a PWB dissipate heat from a side opposite the side that is in contact with the PWB. If the heat-dissipating side of the electronic modules could be exposed, air cooling would be possible. However, in the two-card assembly, the electronic modules are sandwiched between two PWBs. In addition, for many applications, the two-card assemblies are secured in a chassis. Embodiments of the invention relate to a conductive thermal management architecture for electronic modules in a two-card assembly. The exemplary electronic modules that are detailed for explanatory purposes are Half-Bridge modules. However, the conductive heat transfer facilitated by the architecture detailed herein is equally applicable to other electronic modules that dissipate heat in the same manner as the Half-Bridge modules. Exemplary applications of these embodiments include deep space, underwater-based, and ground-based applications.

Figure 1A:
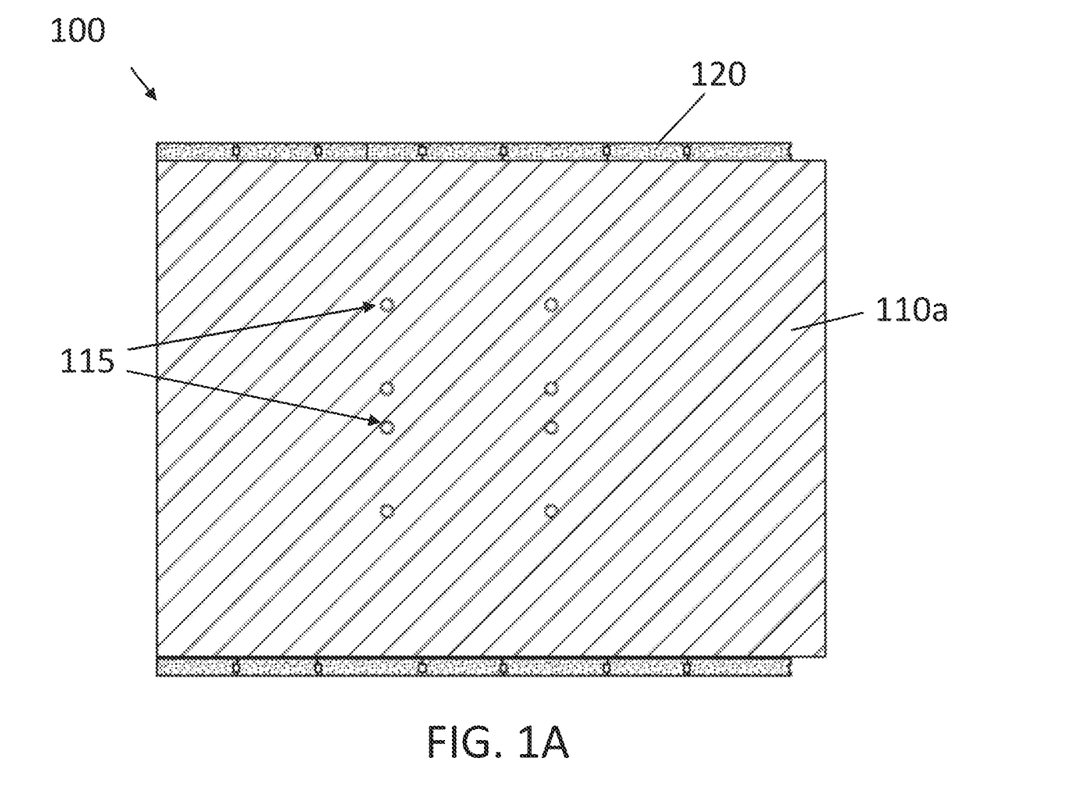
FIG. 1A shows a side of an exemplary two-card assembly, according to one or more embodiments, in which an upper printed wiring board (PWB) is visible.
Figure 1B:
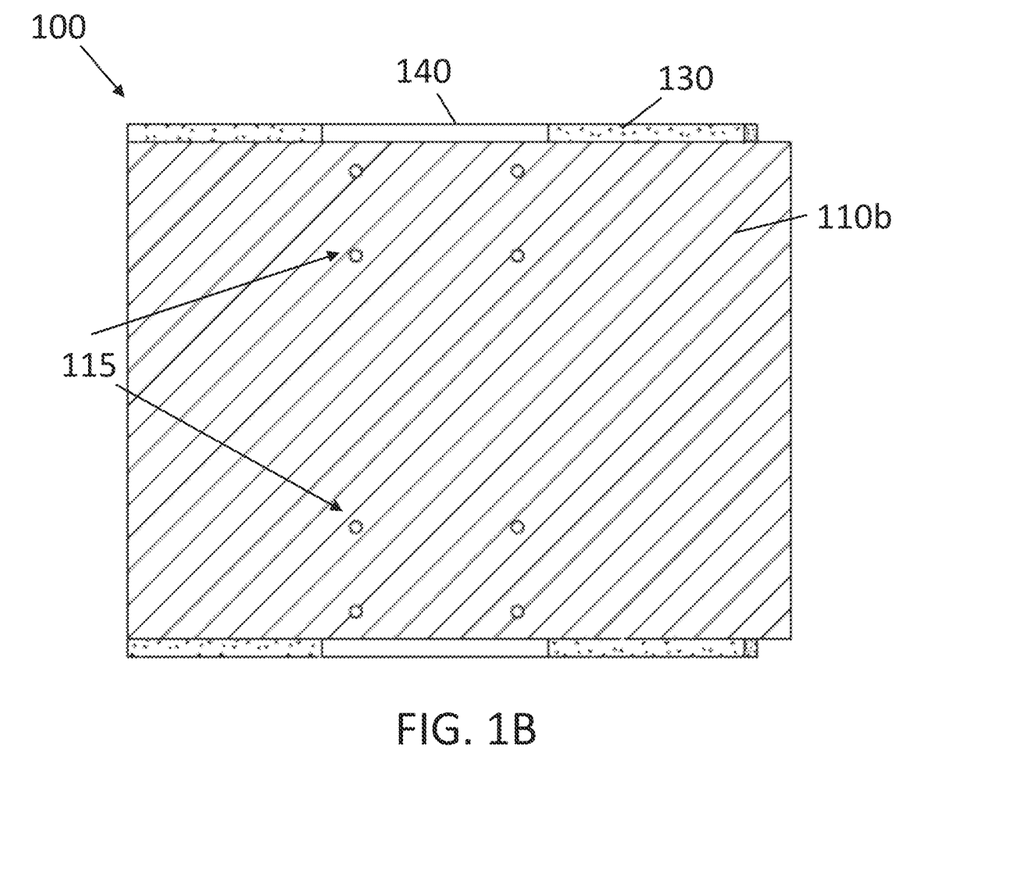
FIG. 1B shows an opposite side of the two-card assembly shown in FIG. 1A, in which a lower PWB is visible.

FIGS. 1A and 1B show two sides of a two-card assembly 100 according to one or more embodiments. The terms "upper" and "lower" are used only for explanatory purposes and do not limit the orientation of the two-card assembly 100 in any way. FIG. 1A shows a side of a two-card assembly 100 in which an upper PWB 110a is visible. The holes 115 correspond with optional screw holes for an optional cover of the upper PWB 110a. Wedge locks 120 are also visible in the view of FIG. 1A. These wedge locks 120 are used to secure the two-card assembly 100 inside the chassis of an electronic box.

Figure 6:
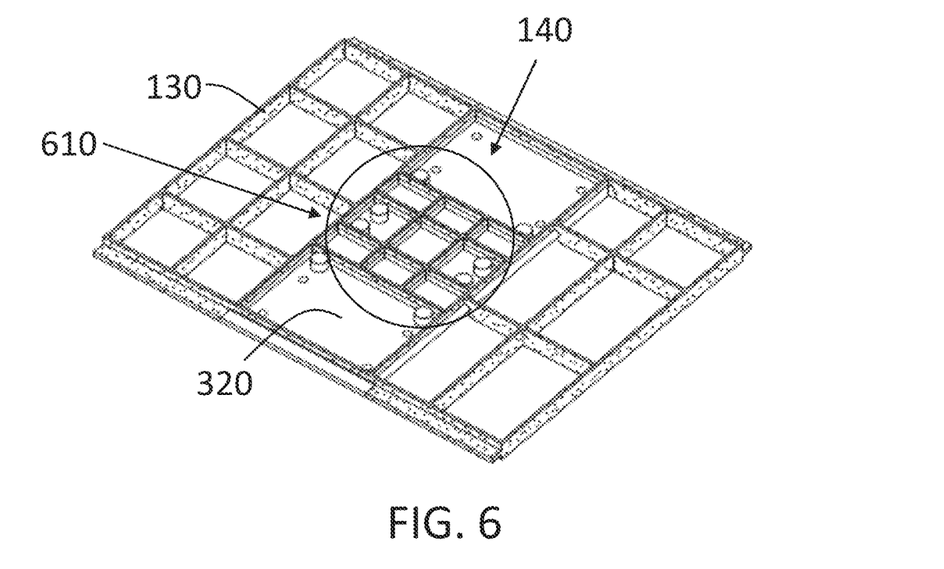
FIG. 6 shows the lower stiffener and the center stiffener according to an exemplary embodiment.

FIG. 1B shows an opposite side of the two-card assembly 100 as FIG. 1A in which a lower PWB 110b is visible. Like the upper PWB 110a in FIG. 1A, the lower PWB 110b in FIG. 1B is shown with optional holes 115 for an optional cover. Portions of a lower stiffener 130 and a center stiffener 140 that are between the upper PWB 110a and the lower PWB 110b are visible. The center stiffener 140 can also be referred to as a center portion of the lower stiffener 130 since it fits into a slot 1010 (FIG. 9) at a center portion of the lower stiffener 130 as shown in FIG. 6. Exemplary non-limiting dimensions of the two-card assembly 100 for a 3 kilowatt (kW) bi-directional direct current DC-DC converter are on the order of 15 inches long, 11 inches wide, and 2 inch deep.

Figure 2:
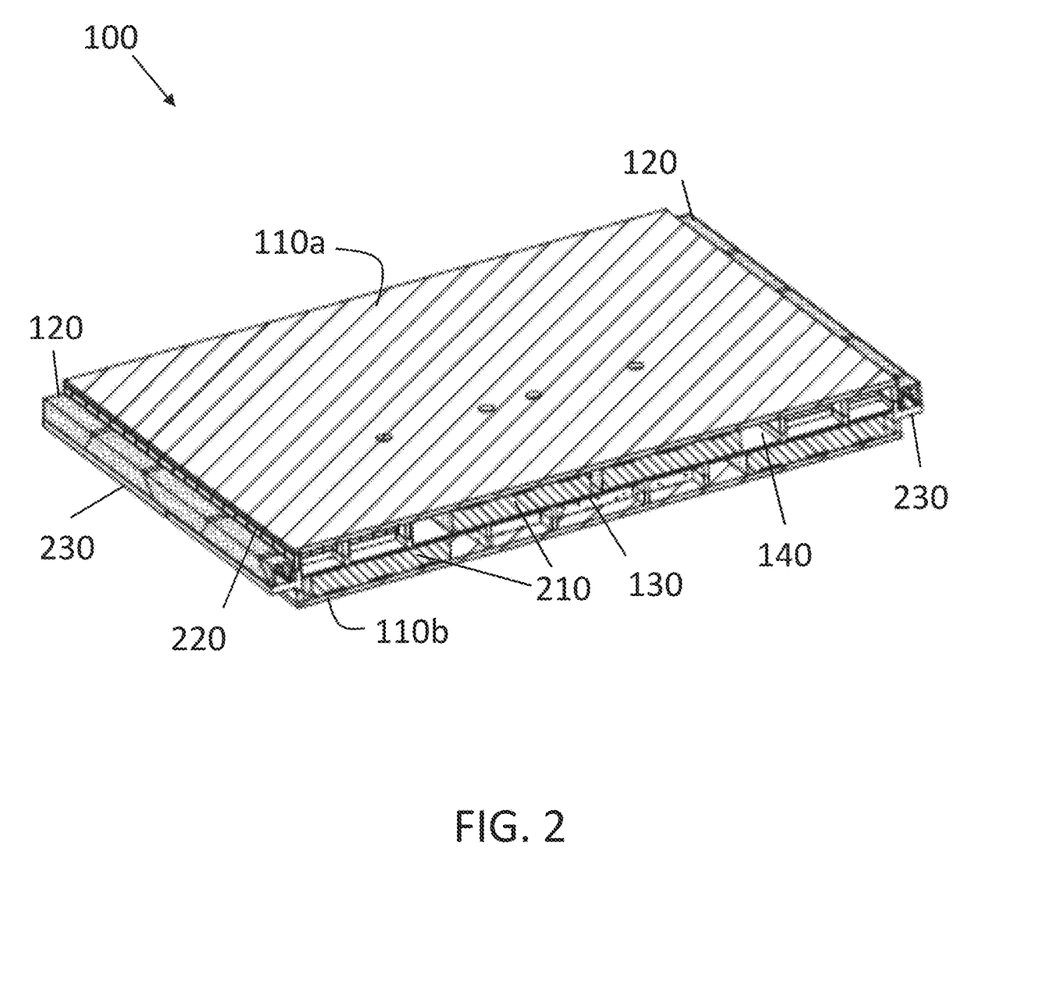
FIG. 2 is a cutaway perspective view of an exemplary two-card assembly according to one or more embodiments.

FIG. 2 is a sectional isometric view of an exemplary two-card assembly 100 according to one or more embodiments. The sectional view exposes components between the upper PWB 110a and the lower PWB 110b. The wedge locks 120 and the wedge lock mount rails 230 on either side of the two-card assembly 100 are shown. As previously noted, the wedge locks 120 are used to secure the two-card assembly 100 in a chassis of an electronic box. Torque is applied on a wedge lock screw (not shown) to install the wedge locks 120 in the chassis. The wedge lock screw torque subjects the wedge locks 120 to both axial and normal force. The normal force is transferred to the lower stiffener 130 and the center stiffener 140 as a compressive force that ensures that the center stiffener 140 is held firmly in the slot 1010 (FIG. 9) at the center of the lower stiffener 130. While the lower stiffener 130 is bonded to the lower PWB 110b and the upper stiffener 220 is bonded to the upper PWB 110a, the center stiffener 140, which sits in a slot 1010 (FIG. 9) at the center of the lower stiffener 130, is only held in place by the wedge locks 120. As a result, the center stiffener 140 is easily removable so that the electronic modules 210 attached to the center stiffener 140 can be repaired or replaced.

The two card assembly 100 of FIG. 2 includes four electronic modules 210 between the upper and lower PWBs 110a, 110b. Exemplary electronic modules 210 include Half-Bridge modules. For example, the four half-bridge modules shown in FIG. 2 dissipate a total of 190 Watts. There are fourteen metal-oxide-semiconductor field effect transistors (MOSFETs) and thirteen diodes inside each Half-Bridge module. Based on the architecture of the two-card assembly 100 according to one or more embodiments, the junction temperature of the MOSFETs and diodes is maintained below the derated junction temperature of 125 degrees Celsius. This can be verified via thermal analysis of the two-card assembly 100. According to alternate embodiments, the electronic modules 210 may be diodes, transistors, magnetics, or DC-DC converters. Not only does the two-card assembly 100 according to one or more embodiments provide the necessary heat flow to meet temperature requirements but the stiffeners also provide the structural support needed to meet vibration and pyroshock requirements. Structural analysis of the two-card assembly 100 may be used to verify this.

Figure 3A:
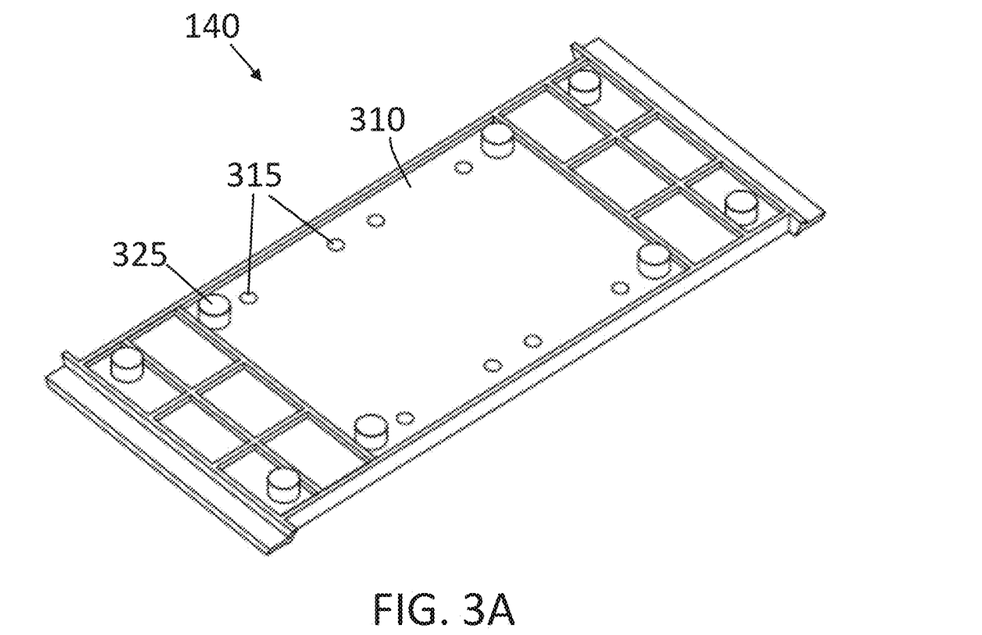
FIG. 3A shows an upper side of the center stiffener according to one or more embodiments.
Figure 3B:
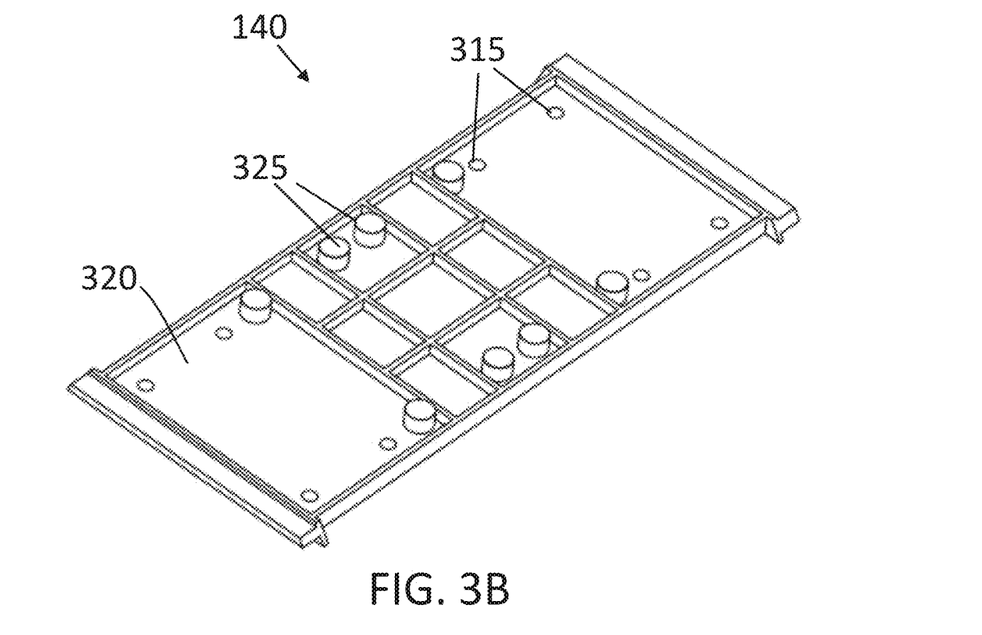
FIG. 3B shows a lower side of the center stiffener according to one or more embodiments.
Figure 4A:
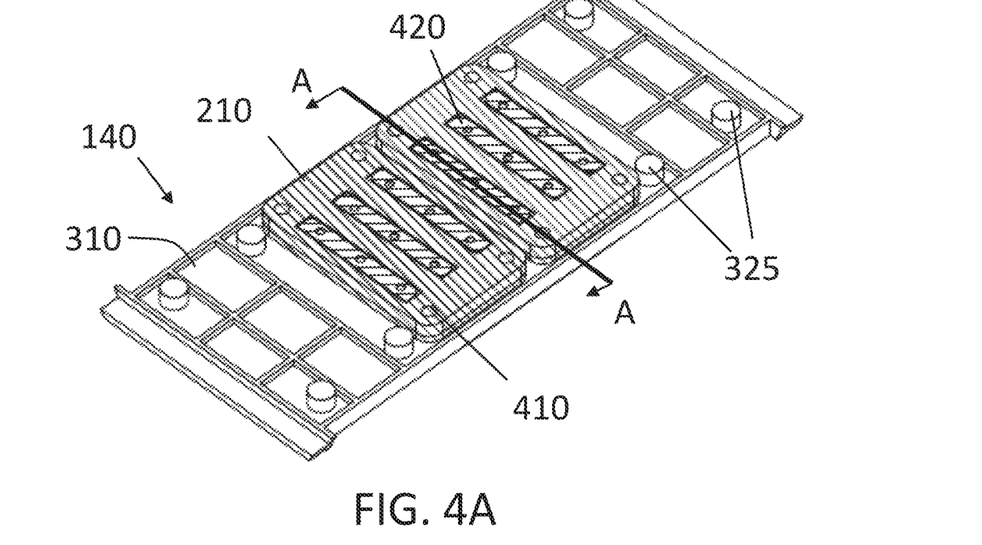
FIG. 4A shows electronic modules secured to an upper side of the center stiffener according to one or more embodiments.

FIGS. 3A and 3B detail the center stiffener 140 according to one or more embodiments. FIG. 3A shows an upper side 310 of the center stiffener 140. The upper side 310 of the center stiffener 140 faces the upper PWB 110a in the two-card assembly 100. The upper side 310 of the center stiffener 140 accommodates two electronic modules 210 in the center as shown in FIG. 4A. Screw holes 315 are indicated for securing the electronic modules 210 to the center stiffener 410. The screw holes 315 correspond with screws 325 on the opposite side of the center stiffener 140, just as the screws 325 on the upper side 310 of the center stiffener 140 correspond with screw holes 315 on the opposite side, as shown in FIG. 3B.

Figure 4B:
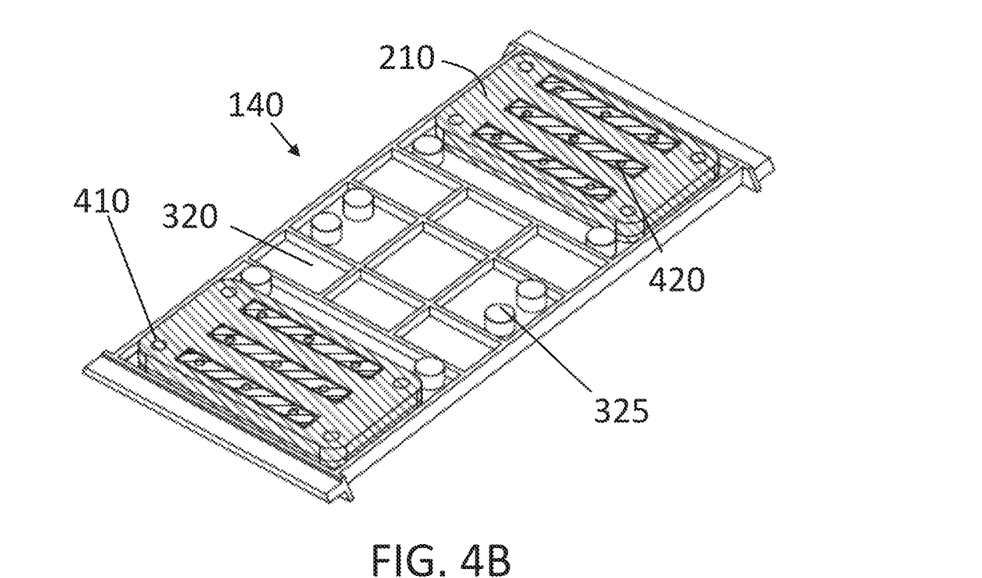
FIG. 4B shows electronic modules secured to a lower side of the center stiffener according to one or more embodiments.

FIG. 3B shows a lower side 320 of the center stiffener 140. The lower side 320 of the center stiffener 140 faces the lower PWB 110b in the two-card assembly 100. The lower side 320 of the center stiffener 140 accommodates two electronic modules 210 at the ends as shown in FIG. 4B. The screws 325 shown in FIG. 3A correspond with the screw holes 315 shown in FIG. 3B and are used to secure the electronic modules 210 to the lower side 320 of the center stiffener 140. The screws 325 shown in FIG. 3B correspond with the screw holes 315 shown in FIG. 3A that secure the electronic modules to the upper side 310 of the center stiffener 140.

FIGS. 4A and 4B show electronic modules 210 secured to each side of the center stiffener 140 according to one or more embodiments. FIG. 4A shows electronic modules 210 secured to an upper side 310 of the center stiffener 140. The screw holes 410 shown at the corners of the electronic modules 210 correspond with the screws 325 shown in FIG. 4B to secure the electronic modules 210 to the upper side 310 of the center stiffener 140. The threaded holes 420 shown in three rows of three for each electronic module 210 are used to secure each electronic module 210 to the upper PWB 110a. As previously noted, heat from the electronic module 210 is dissipated on the side opposite the side that is secured to the upper PWB 110a. That is, heat is dissipated from the electronic modules 210 to the surface of the upper side 310 of the center stiffener 140. A cross-section indicated as A-A is shown in FIG. 5.

FIG. 4B shows electronic modules 210 secured to a lower side 320 of the center stiffener 140. The screw holes 410 shown at the corners of the electronic modules 210 correspond with the screws 325 shown in FIG. 4A and secure the electronic modules 210 to the lower side 320 of the center stiffener 140. The threaded holes 420 used to secure the electronic modules 210 to the lower PWB 110b are also shown. In the case of the electronic modules 210 shown in FIG. 4B, heat is dissipated on the side opposite the side that is secured to the lower PWB 110b. Thus, heat is dissipated from the electronic modules 210 to the surface of the lower side 320 of the center stiffener 140.

Figure 5:
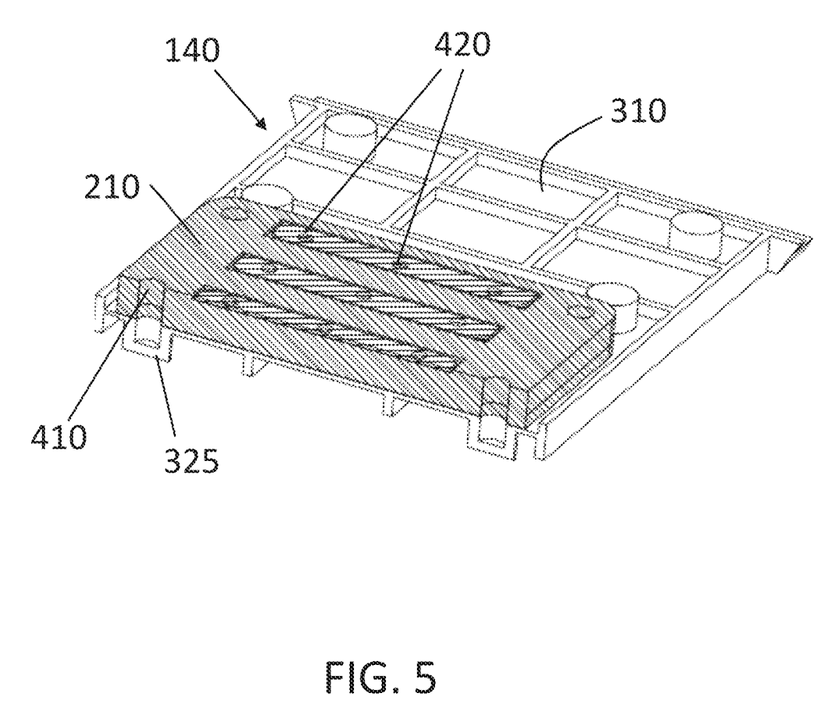
FIG. 5 is a cross-sectional view through A-A as indicated in FIG. 4A.

FIG. 5 is a cross-sectional view through A-A as indicated in FIG. 4A. The cross-sectional view is through an electronic module 210 secured to an upper side 310 of the center stiffener 140. The view shows two screws 325 on the lower side 320 of the center stiffener 140 that corresponds with the screw holes 410 in the electronic module 210.

FIG. 6 shows the lower stiffener 130 and the center stiffener 140 according to one or more embodiments. The perspective shown in FIG. 6 is such that the center stiffener 140 is dropped into a slot in the lower stiffener 130, the lower side 320 of the center stiffener 140 is visible and the lower stiffener 130 is shown above the center stiffener 140. Thus, the structural support provided by the lower stiffener 130 to the center stiffener 140 in area 610 is visible.

Figure 7:
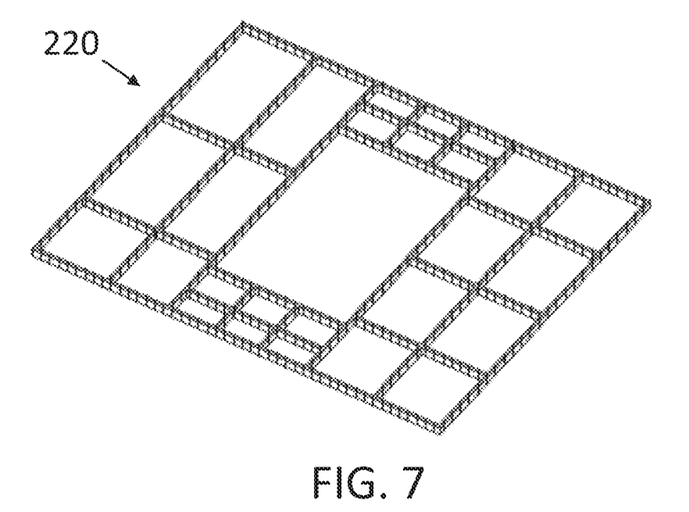
FIG. 7 shows the upper stiffener according to an exemplary embodiment.

FIG. 7 shows the upper stiffener 220. The upper stiffener 220 is on the opposite side of the center stiffener 140 as the lower stiffener 130 (i.e., the same side as the upper side 310 of the center stiffener 140). The lower stiffener 130, center stiffener 140, and upper stiffener 220 may all be fabricated from aluminum alloy. For example, 2000, 6000, or 7000 series aluminum alloys may be used.

Figure 8A:
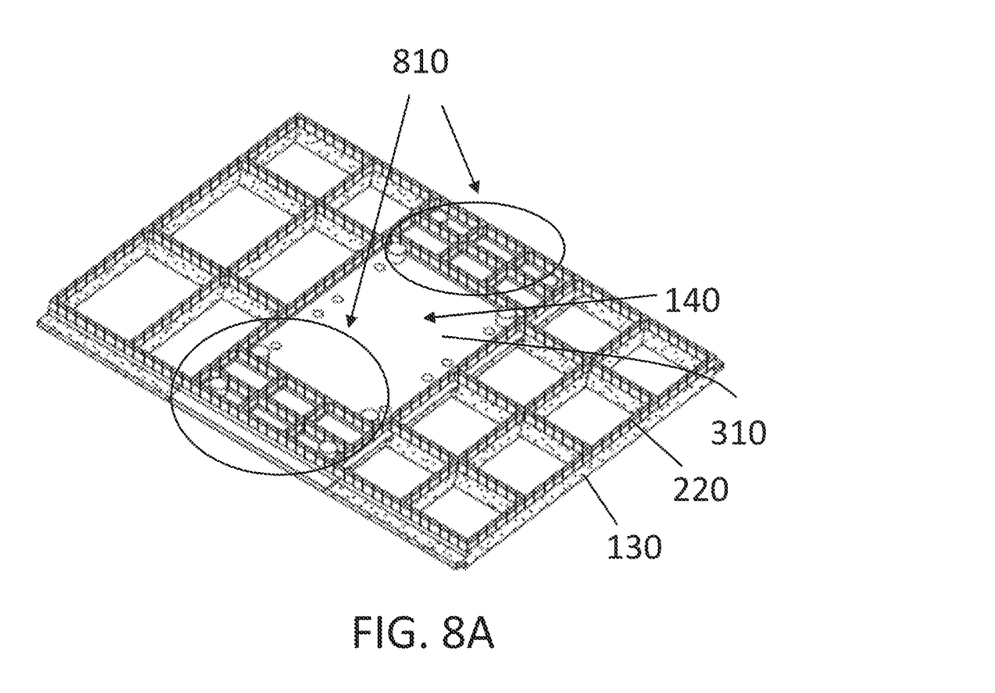
FIG. 8A shows an upper side of the center stiffener with the upper stiffener above and the lower stiffener below.
Figure 8B:
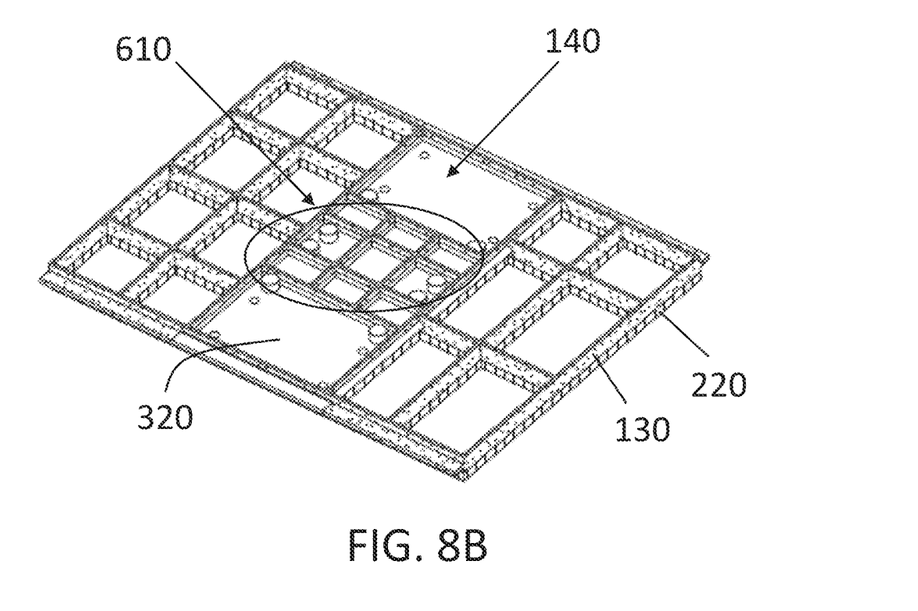
FIG. 8B shows a lower side of the center stiffener with the upper stiffener below and the lower stiffener above.

FIGS. 8A and 8B show opposite sides of the structure of the stiffeners 130, 140, 220 according to one or more embodiments. FIG. 8A shows the upper side 310 of the center stiffener 140 with the upper stiffener 220 above and the lower stiffener 130 below. The area 810 in which the upper stiffener 220 provides support to the center stiffener 140 corresponds with the location of the electronic modules 210 on the lower side 320 of the center stiffener 140. FIG. 8B shows a lower side 320 of the center stiffener 140 with the upper stiffener 220 below and the lower stiffener 130 above. The area 610 in which the lower stiffener 130 supports the center stiffener 140 corresponds with the location of the electronic modules 210 on the upper side 310 of the center stiffener 140.

Figure 9A:
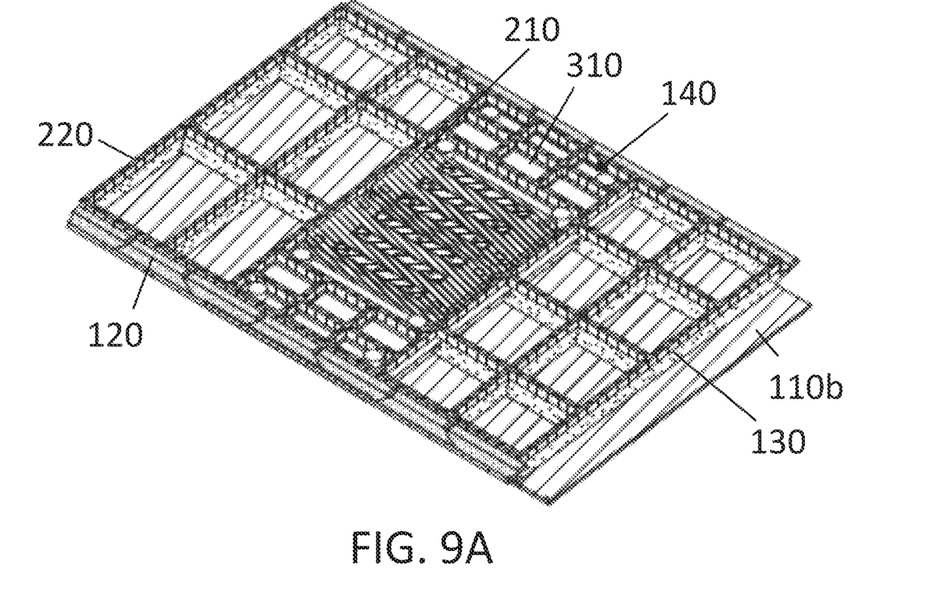
FIG. 9A shows the structure of FIG. 8A with the lower PWB below the lower stiffener.
Figure 9B:
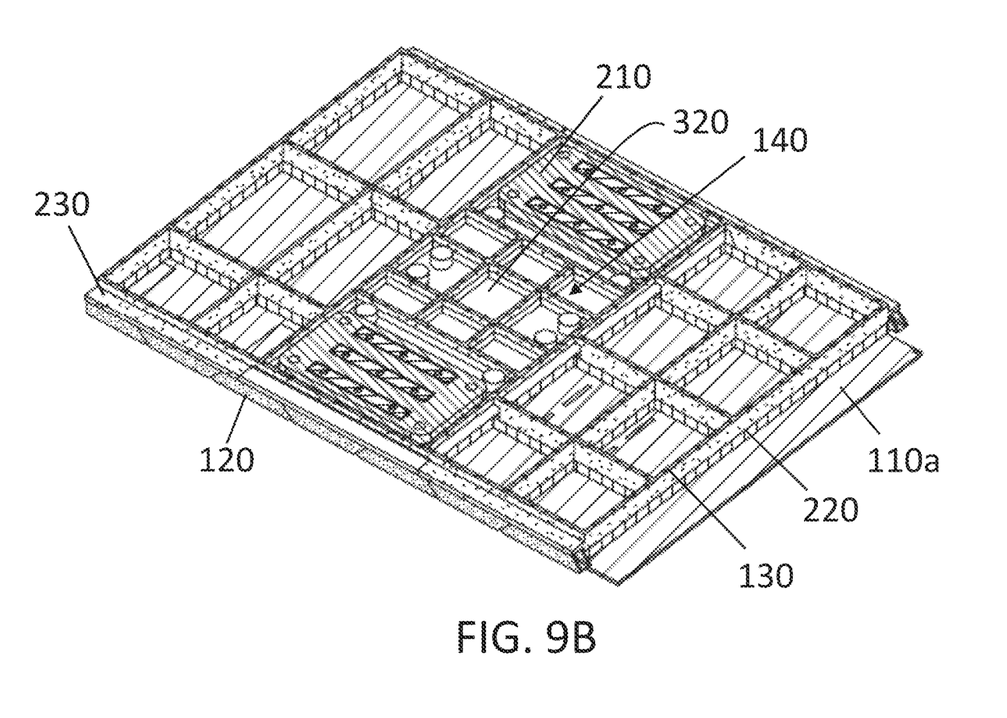
FIG. 9B shows the structure of FIG. 8B with the upper PWB below the upper stiffener.

FIGS. 9A and 9B show the structure in FIGS. 8A and 8B on PWBs 110b and 110a, respectively. FIG. 9A shows the upper side 310 of the center stiffener 140 with the upper stiffener 220 above, the lower stiffener 130 below, and the lower PWB 110b below the lower stiffener 130. The wedge locks 120 are also shown. FIG. 9B shows the lower side 320 of the center stiffener 140 with the upper stiffener 220 below, the lower stiffener 130 above, and the upper PWB 110a below the upper stiffener 220. The view in FIG. 9B shows that the wedge lock mount rail 230 is made up of edges of the lower stiffener 130 and the center stiffener 140. As discussed with reference to FIGS. 4A and 4B, heat from the electronic modules 210 is dissipated to the surface of the center stiffener 140. The center stiffener 140 achieves conductive heat dissipation by channeling the heat from the electronic modules 210 on both sides of its surface to the wedge lock mounting rail 230. This is further detailed with reference to FIG. 11.

Figure 10:
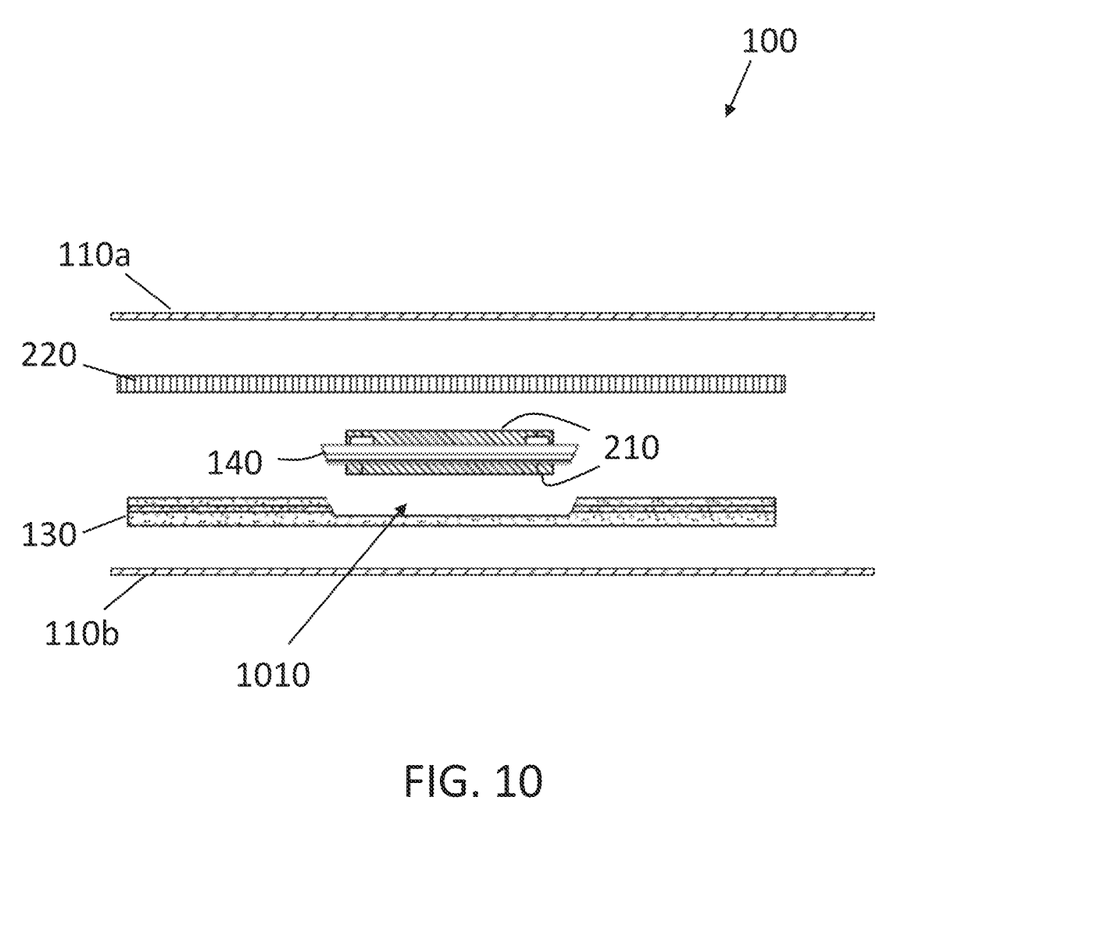
FIG. 10 is an exploded view of the two-card array according to one or more embodiments.

FIG. 10 is an exploded view of the two-card assembly 100 according to one or more embodiments. The wedge locks 120 are not shown. The upper PWB 110a is bonded to the upper stiffener 220, and the lower PWB 110b is bonded to the lower stiffener 130 using two-sided adhesive. The center stiffener 140 has a wedge-shaped cross-section, as indicated in FIG. 10. The center stiffener 140, with the electronic power modules 210 secured on both surfaces, sits in a wedge-shaped slot 1010 formed in the lower stiffener 130. Thus, once the electronic modules 210 are unscrewed from whichever PWB 110a, 110b they are secured to, the center stiffener 140 can be lifted out of the slot 1010 for repair or replacement of the electronic modules 210, as needed.

Figure 11:
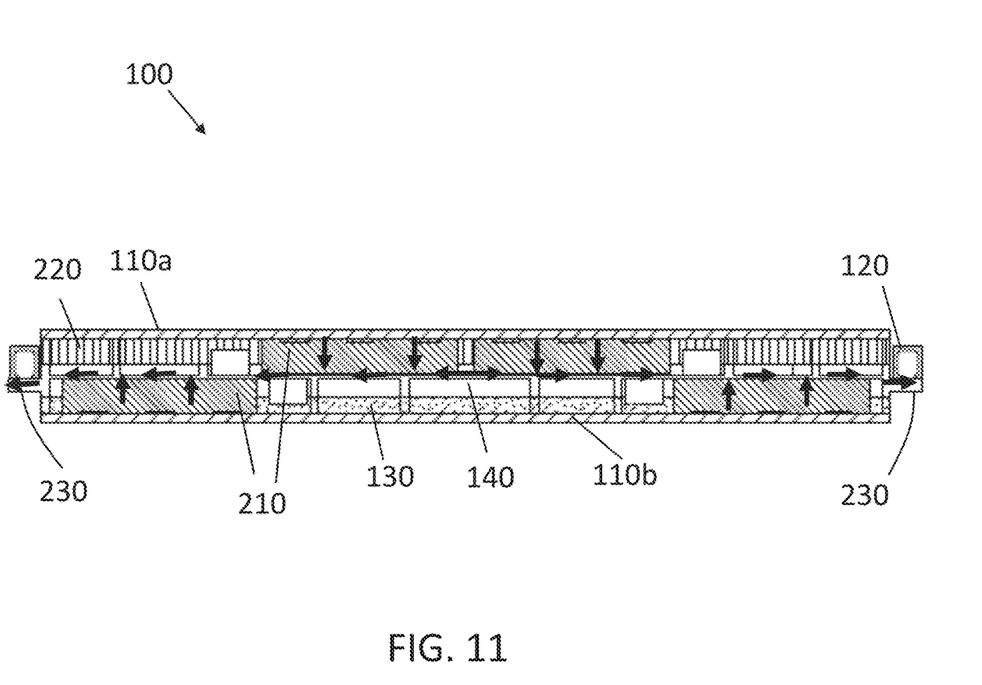
FIG. 11 is a cross-sectional view of the two-card assembly indicating the heat flow according to one or more embodiments.

FIG. 11 is a cross-sectional view of the two-card assembly 100 indicating the heat flow according to one or more embodiments. According to the exemplary orientation shown in FIG. 11, the downward arrows indicate heat flow from the electronic modules 210 secured to the upper side 310 of the center stiffener 140 to the surface of the center stiffener 140. Upward arrows indicate heat flow from the electronic modules 210 secured to the lower side 320 of the center stiffener 140 to the surface of the center stiffener 140. The heat at the surface of the center stiffener 140 is then conducted outward to the wedge lock mounting rails 230. The temperature of the wedge lock mounting rails 230 may be controlled by a heat sink (e.g., convective heat sink, radiative heat sink, a combination of the two), for example.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A two-card assembly comprising:
a first printed wiring board (PWB) on a first side of the two-card assembly;
a first stiffener secured to the first PWB;
a second PWB on a second side of the two-card assembly;
a second stiffener secured to the second PWB;
a center stiffener disposed between the first stiffener and the second stiffener, wherein the center stiffener is disposed in a slot that is formed within the second stiffener; and
one or more electronic modules secured to the center stiffener, wherein the center stiffener dissipates heat from the one or more electronic modules.

2. The two-card assembly according to claim 1, further comprising wedge locks configured to secure the center stiffener between the first stiffener and the second stiffener based on compressive force.

3. The two-card assembly according to claim 2, further comprising a first wedge lock mounting rail configured to support a first set of the wedge locks, and a second wedge lock mounting rail configured to support a second set of the wedge locks.

4. The two-card assembly according to claim 3, wherein first edges of the second stiffener and center stiffener form the first wedge lock mounting rail and second edges of the second stiffener and center stiffener form the second wedge lock mounting rail.

5. The two-card assembly according to claim 1, wherein the first stiffener is bonded to the first PWB, and the second stiffener is bonded to the second PWB.

6. The two card assembly according to claim 1, wherein a material of the first stiffener, the second stiffener, and the center stiffener is aluminum alloy.

7. The two-card assembly according to claim 1, wherein a first one or more of the electronic modules are secured to a first side of the center stiffener and a second one or more of the electronic modules are secured to a second side of the center stiffener.

8. The two-card assembly according to claim 7, wherein the first one or more of the electronic modules are also secured to the first PWB.

9. The two-card assembly according to claim 7, wherein the second one or more of the electronic modules are also secured to the second PWB.

10. A method of assembling a two-card assembly, the method comprising:
securing a first printed wiring board (PWB), on a first side of the two-card assembly, to a first stiffener;
securing a second PWB, on a second side of the two-card assembly, to a second stiffener;
disposing a center stiffener between the first stiffener and the second stiffener, wherein the disposing includes disposing the center stiffener within a slot that is formed in the second stiffener; and
securing one or more electronic modules to the center stiffener to dissipate heat via the center stiffener.

11. The method according to claim 10, further comprising using compressive force transferred via wedge locks to secure the center stiffener between the first stiffener and the second stiffener.

12. The method according to claim 11, further comprising supporting a first set of the wedge locks on a first wedge lock mounting rail formed of first edges of the second stiffener and center stiffener, and supporting a second set of the wedge locks on a second wedge lock mounting rail formed of second edges of the second stiffener and center stiffener.

13. The method according to claim 10, wherein the securing the first PWB to the first stiffener includes bonding the first stiffener to the first PWB, and the securing the second PWB to the second stiffener includes bonding the second stiffener to the second PWB.

14. The method according to claim 10, further comprising fabricating the first stiffener, the second stiffener, and the center stiffener from aluminum alloy.

15. The method according to claim 10, wherein the securing the one or more electronic modules to the center stiffener includes securing a first one or more of the electronic modules to a first side of the center stiffener.

16. The method according to claim 15, further comprising securing the first one or more of the electronic modules to the first PWB.

17. The method according to claim 10, wherein the securing the one or more electronic modules to the center stiffener includes securing a second one or more of the electronic modules to a second side of the center stiffener.

18. The method according to claim 17, further comprising securing the second one or more of the electronic modules to the second PWB.

* * * * *